(12) United States Patent
Ikeda et al.

(10) Patent No.: US 6,759,082 B2
(45) Date of Patent: Jul. 6, 2004

(54) METAL FOIL LAMINATED PLATE AND METHOD OF MANUFACTURING THE SAME

(75) Inventors: Kenichi Ikeda, Ibaraki (JP); Toshiyuki Kawashima, Ibaraki (JP); Nobuharu Tahara, Ibaraki (JP)

(73) Assignee: Nitto Denk Corporation, Osaka (JP)

( * ) Notice: Subject to any disclaimer, the term of this patent is extended or adjusted under 35 U.S.C. 154(b) by 0 days.

(21) Appl. No.: 10/151,072

(22) Filed: May 17, 2002

(65) Prior Publication Data

US 2002/0172812 A1 Nov. 21, 2002

(30) Foreign Application Priority Data

May 21, 2001 (JP) ........................................ 2001-150466

(51) Int. Cl.[7] .......................... B05D 5/12; H01B 13/00
(52) U.S. Cl. .......................... 427/58; 427/97; 427/256; 427/282; 216/13; 216/19
(58) Field of Search ...................... 427/58, 96, 256, 427/97, 282; 216/13, 19

(56) References Cited

U.S. PATENT DOCUMENTS

| | | | |
|---|---|---|---|
| 5,346,750 A | * | 9/1994 | Hatakeyama et al. ....... 428/209 |
| 5,650,199 A | * | 7/1997 | Chang et al. ................ 427/333 |
| 6,137,687 A | * | 10/2000 | Shirai et al. ................. 361/749 |
| 2001/0045407 A1 | * | 11/2001 | Patel et al. ................... 216/13 |
| 2002/0137347 A1 | * | 9/2002 | Patel et al. ................. 438/694 |

FOREIGN PATENT DOCUMENTS

| | | | |
|---|---|---|---|
| JP | 6-268345 | | 9/1994 |
| JP | 307231 | * | 11/1997 |
| JP | 9-324060 | | 12/1997 |
| JP | 319442 | * | 11/2000 |

* cited by examiner

*Primary Examiner*—Brian K. Talbot
(74) *Attorney, Agent, or Firm*—Knobbe, Martens, Olson & Bear, LLP

(57) ABSTRACT

The present invention provides a method of manufacturing a metal foil laminated plate comprising the step of forming and attaching a resin porous layer onto a metal foil by a wet coagulating method, wherein a metal foil including a conductive bump having an almost equal height on a film forming side surface is used. The present invention provides a metal foil laminated plate comprising a metal foil including a conductive bump having an almost equal height and a resin porous layer laminated integrally, the conductive bump being exposed. The present invention provides another metal foil laminated plate comprising a metal foil including a conductive bump having an almost equal height, a resin porous layer laminated integrally, and a thermosetting resin impregnated in a hole of the resin porous layer, in which the conductive bump is exposed from the resin porous layer.

7 Claims, 2 Drawing Sheets

METAL FOIL LAMINATED PLATE AND METHOD OF MANUFACTURING THE SAME

BACKGROUND OF THE INVENTION

1. Field of the Invention

The present invention relates to a method of manufacturing a metal foil laminated plate comprising the step of forming and sticking a resin porous layer on to a metal foil having a conductive bump and to a metal foil laminated plate obtained by the manufacturing method and is useful for a technique for conductively connecting the wiring layers of a multiplayer wiring board.

2. Description of the Related Art

In recent years, an increase in the density of a wiring board has been required with a reduction in the size and weight of electronic equipment. Correspondingly, the multilayer structure of a wiring layer has been enhanced. As such a structure of the multilayer wiring board, generally, an insulating layer and a wiring layer having a pattern formed thereon are sequentially laminated and the wiring layer is conductively connected through an inner via hole. As the conductive connecting method, there have been known a method of plating the inner peripheral surface of a via hole, a method of plating the internal space of the via hole to form a metal column, a method of filling a conductive paste in the internal space of the via hole, and the like.

As disclosed in Japanese Patent Application Laid-Open No. 6-268345, particularly, attention has been paid, in respect of the reliability of an inter layer connection, to a method comprising the steps of forming a through hole on a prepreg having a releasing film on at least one of surfaces of a prepreg base material, filling a conductive paste in the through hole, separating the releasing film, laminating a metal foil on a surface from which the releasing film is separated, and heating and pressurizing to form the laminated product.

In the method of carrying out metal plating or filling a conductive paste after the formation of the via hole, however, there is a tendency that a laser processing is required or the steps are complicated.

On the other hand, there has been known a technique for utilizing a resin porous film as the insulating layer of a multilayer wiring board in order to reduce a dielectric constant. Moreover, there has been known a prepreg for a wiring board impregnated with the half cured thermosetting resin in the hole of the resin porous film. In such cases, however, a connecting structure for conductively connecting wiring layers is formed separately from the formation of the resin porous layer.

Therefore, it is an object of the present invention to provide a method of manufacturing a metal foil laminated plate in which opening the via holes is not required and a connecting structure for conductively connecting wiring layers is obtained at a simple step and a metal foil laminated plate which is obtained by the manufacturing method.

SUMMARY OF THE INVENTION

The object can be attained by the present invention in the following manner.

More specifically, the present invention provides a method of manufacturing a metal foil laminated plate comprising the step of forming and attaching a resin porous layer onto a metal foil by a wet coagulating method, wherein a metal foil including a conductive bump having an almost equal height on a film forming side surface is used. According to the manufacturing method of the present invention, a metal foil including a conductive bump having an almost equal height on a film forming side surface is used as a metal foil for forming and attaching a resin porous film by a wet coagulating method. Therefore, it is possible to form the conductive connecting structure for wiring layers simultaneously with the formation of the resin porous layer. Accordingly, the hole-opening step is not required and a connecting structure for conductively connecting the wiring layers can be obtained at a simple step.

It is preferable that an amount of application of a film forming solution should be regulated such that the height of the surface of a resin porous layer after the film formation is almost equal to that of the conductive bump. In this case, the conductive bump can be easily exposed to a surface, and furthermore, the resin porous layer can be prevented from being lower than the conductive bump to generate concavo-convex portions.

On the other hand, the present invention provides a metal foil laminated plate comprising a metal foil including a conductive bump having an almost equal height and a resin porous layer laminated integrally, the conductive bump being exposed. According to the metal foil laminated plate of the present invention, the wiring layers can be conductively connected by the conductive bump, and furthermore, the resin porous layer has the function of insulating the wiring layers. Moreover, it is possible to reduce a dielectric constant and a dielectric loss by the resin porous layer.

Further, another metal foil laminated plate of the present invention provides a metal foil laminated plate comprising a metal foil including a conductive bump having an almost equal height, a resin porous layer laminated integrally, and a thermosetting resin impregnated in a hole of the resin porous layer, the conductive bump being exposed from the resin porous layer.

According to another metal foil laminated plate of the present invention, the wiring layers can be conductively connected by the conductive bump. In addition, the metal foil laminated plate according to the present invention can be sequentially bonded and laminated by a thermosetting resin impregnated in the hole of the resin porous layer. Consequently, it is possible to easily manufacture a multi-layer wiring board.

DETAILED DESCRIPTION OF THE PREFERRED EMBODIMENTS

A preferred embodiment of the present invention will be described below with reference to the drawings.

A metal foil laminated plate according to the present invention is characterized by a method of manufacturing a metal foil laminated plate including the step of forming and attaching a resin porous layer 5 on a metal foil by a wet coagulating method in which a metal foil 10 including a conductive bump 2a having an almost equal height on a film forming side surface is used as a metal foil, as shown in FIG. 1.

First of all, a method of forming the metal foil 10 including the bump 2a will be described. Examples of the method of forming the metal foil 10 include a method of forming the metal foil 10 by plating and a method of forming the metal foil 10 with a conductive paste and the like in addition to a method of forming the metal foil 10 by etching as shown in FIG. 1. In respect of conductiveness, durability and conducting reliability, particularly, it is preferable to use a method of forming a metallic bump to be the conductive bump 2a by etching or plating.

Figure 1A:
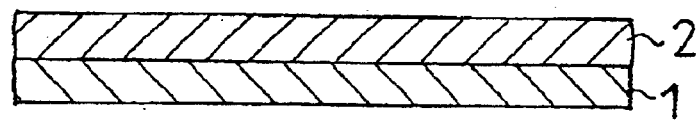
FIG. 1 is a view showing a step according to one embodiment of a method of manufacturing a metal foil laminated plate according to the present invention.

In the method of forming the conductive bump 2a by etching, a laminated plate consisting of two kinds of metal layers 1 and 2 shown in FIG. 1(a) is prepared. One of the metal layers 1 and 2 constituting the laminated plate acts as a wiring layer and the other becomes the conductive bump 2a. Therefore, a metal corresponding to each material is selected. In respect of the adhesion of a resin porous layer 5 by the wet coagulating method or the workability of a wiring pattern, it is preferable that the metal layer 1 to be the wiring layer may be copper. Moreover, a metal which can be selectively etched during the etching the metal layer 2 is chosen for the other metal layer 2. More specifically, aluminum or the like can be used. A cladding material, a plating material and the like can be used for the laminated plate.

Figure 1B:
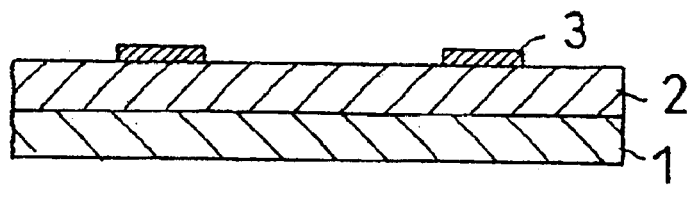

As shown in FIG. 1(b), next, a mask layer 3 to resist the etching is formed in a portion on the surface of the metal layer 2 in which the conductive bump 2a is to be formed. Screen printing or photolithography can be utilized for forming the mask layer 3. The size of each mask layer 3 is determined corresponding to the area of the upper surface of the conductive bump 2a and can have a diameter of 5 to 500 $\mu$m. Furthermore, the shape of the upper surface of the conductive bump 2a can be controlled by the shape of the mask layer 3 and may be a circle, a square, a shape along a wiring pattern or the like.

Figure 1C:
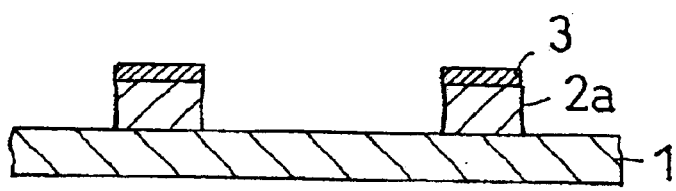

As shown in FIG. 1(c), subsequently, the metal layer 2 is etched to form the conductive bump 2a. At this time, it is preferable that etching conditions should be adjusted to prevent an excessive increase in undercutting. It is preferable that the etching should be carried out by using an etchant for selectively etching the metal layer 2.

Figure 1D:
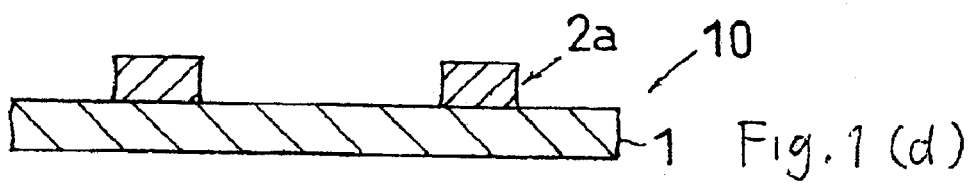

As shown in FIG. 1(d), next, the mask layer 3 is removed. As a removing method, it is preferable to carry out removal using chemicals or separation removal. Consequently, it is possible to manufacture the metal foil 10 including the conductive bump 2a having an almost equal height on the film forming side surface.

On the other hand, as a method of forming the metal foil 10 by plating, a dry film resist 7 is first provided on the metal layer 1 and is then exposed and developed to form an opening 7a and a conductive bump 2a can be formed in that portion by electrolytic plating or the like, as shown in FIGS. 2(a) to 2(d). Then, it is preferable that the dry film resist 7 should be removed by chemicals or a separation. By such a method, the conductive bump 2a and the metal layer 1 can be formed of the same metal.

Moreover, in the case in which the conductive bump 2a is formed of a conductive paste, it is preferable that the conductive paste should be printed in a predetermined portion by a printing method such as screen printing. In that case, the printing may be repeatedly carried out plural times in order to make a thickness to be larger.

Figure 1E:
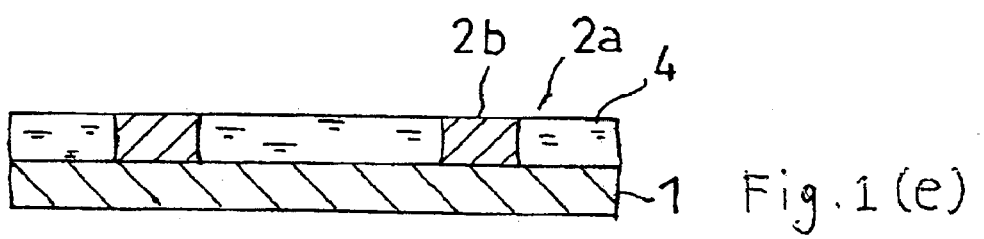
Figure 1F:
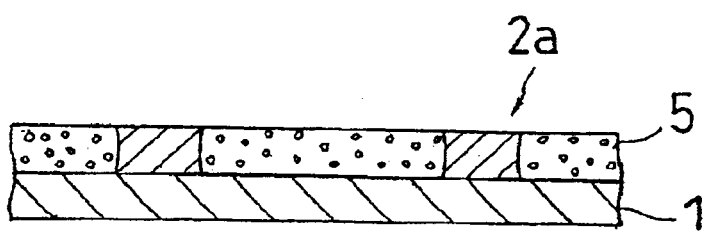
Figure 2A:
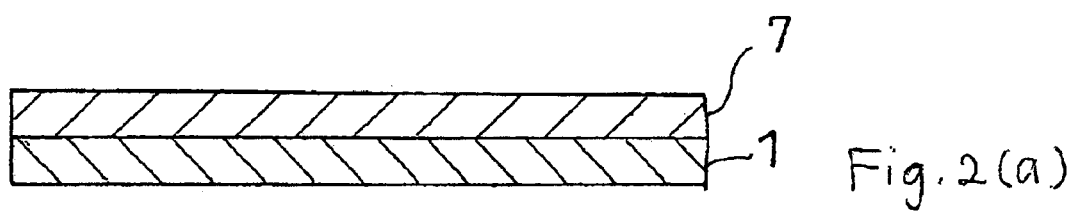
FIG. 2 is a view showing a step according to another embodiment of the method of manufacturing a metal foil laminated plate according to the present invention.
Figure 2B:
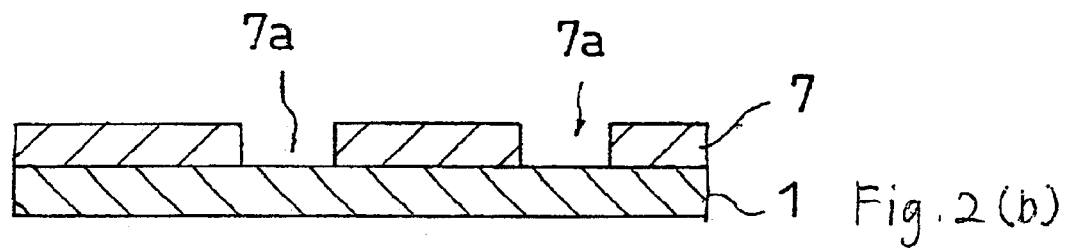
Figure 2C:
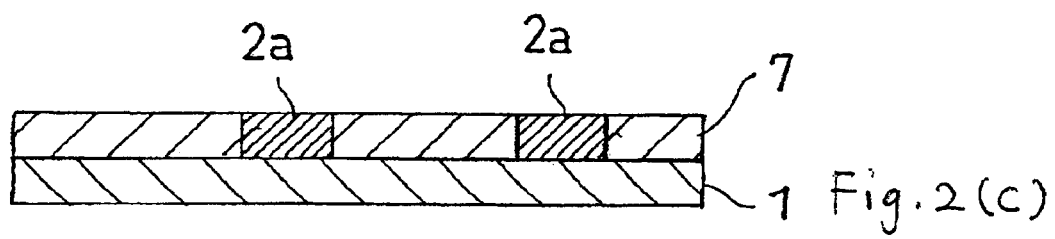
Figure 2D:
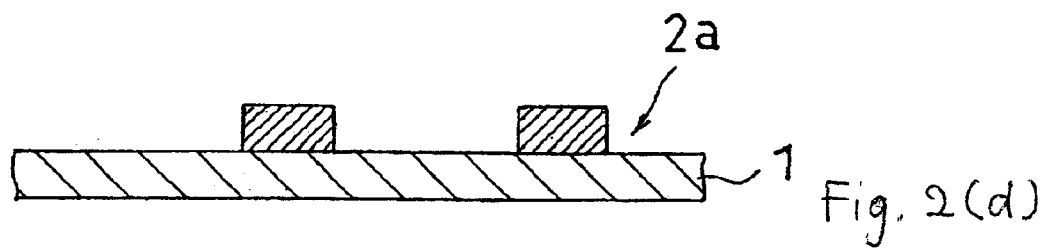

In the present invention, the resin porous layer 5 is formed and attached by the wet coagulating method by using the metal foil 10 as shown in FIGS. 1(e) and 1(f). In that case, it is preferable that the amount of application of a film forming solution 4 should be regulated such that the height of the surface of the resin porous layer 5 after the film formation is almost equal to that of the conductive bump 2a.

It is preferable that the resin porous layer in the present invention should have a void rate of 30 to 90% and a mean pore size of 0.1 to 10 $\mu$m in the case in which a thermosetting resin is to be impregnated. Moreover, the thermosetting resin is not impregnated, a void rate of 10 to 90% and a mean pore size of 0.01 to 3 $\mu$m are preferable.

For the material of the resin porous layer according to the present invention, it is preferable to use a resin having an excellent heat-resisting property and mechanical strength and it is possible to employ various resins, for example, polyimide, polyester, polyamide, particularly, aromatic polyamide, polyamideimide, polyetherimide, polyether sulfone, polyether etherketone and the like. In particular, the polyimide based resin is preferable because of an excellent insulating property and heat-resisting property and an excellent adhesion to a metal layer. Moreover, the aromatic polyamide is also preferable because of an excellent insulating property and heat-resisting property and a low linear expansion coefficient upon heating.

For a metal layer to be a film forming base material, it is possible to use various metals, for example, copper, cupronickel, bronze, brass, aluminum, nickel, iron, stainless, gold, silver, platinum and the like. Preferably, these metal foils have thicknesses of 1 to 50 $\mu$m. In order to enhance the adhesion to a porous layer, it is preferable that the surface of the metal foil should be subjected to various physical or chemical surface treatment processes such as a rough surfacing process and a blackening process.

In the wet coagulation process, generally, a film forming solution (dope) having a resin and an additive dissolved in a solvent is prepared and is applied (cast) to a film forming base material, and is then immersed in a coagulating solution to carry out solvent substitution. Consequently, the resin is coagulated (changed into a gel) and the coagulating solution is then dried and removed. Thus, the porous layer is obtained.

The polyamide based resin mainly including a repetition unit in which an acid residue and an amine residue are imide bonded may contain other copolymerized components and blended compounds. In respect of a heat resistance, a hydroscopic property and a mechanical strength, polyimide having an aromatic group as a main chain, for example, polyimide composed of a polymerized product containing a tetracarboxylic acid component and an aromatic diamine component can be employed. In particular, it is desirable that a polymer having a limiting viscosity of 0.55 to 3.00, preferably, 0.60 to 0.85 (a measured value at 30° C.) can be used. In the case in which a porous layer is to be formed by the wet coagulation process, the polymer having the limiting viscosity within the above range can be formed into a porous layer having an excellent dissolving property in a solvent, a great mechanical strength and independence.

Referring to the polyamide based resin, a polymer or a precursor thereof (polyamide acid) can be used for film formation. The polyamide acid has an advantage that a molecular structure is less restricted because it has a more excellent dissolving property as compared with polyimide. While the polymer may be completely changed into imide, 70% or more of a change rate to imide is permitted. In the case in which a polymer having a comparatively high change rate to imide is used for doping, it is preferable to use a polymer including, in a repetition unit, a component having a high flexibility such as butanetetradicarboxylic anhydride.

Any solvent for dissolving the polyimide based resin or the precursor thereof can be used. It is preferable to use an aprotic polar solvent such as N-methyl-2-pyrrolidone, N,N-dimethylacetamide, N,N-dimethylformamide or dimethylsulfoxide in respect of a dissolving property and a solvent substitution speed for a coagulating solvent in the case in which a porous film is formed by the wet coagulation process. Preferable examples include N-methyl-2-pyrrolidone. Moreover, a solvent such as diethylene glycol, dimethyl ether or diethyleneglycol diethylether maybe mixed to regulate the speed of a solvent substitution in the wet coagulation process.

On the other hand, the aromatic polyamide includes so-called para type aramid and metha type aramid, and those in which a part of their main chain is substituted by diphenyl ether, diphenyl propane, diphenyl methane, diphenyl ketone, diphenyl sulfoxide or those in which biphenyl or a hydrogen group of an aromatic ring is substituted by a methyl group, a halogen atom or the like.

Examples of the para type aramid include poly p-phenyleneterephthalamide. The aramid thus constituted by only a rigid component is to be dissolved in a special reagent. For the aromatic polyamide used for the porous film, accordingly, it is preferable to at least partially use aramid having a part of main chain substituted by a component having a flexibility or the metha type aramid.

Examples of the component giving a flexibility include m-phenylene, 2,7-naphthalene, diphenyl ether, 2,2-diphenyl propane and diphenyl methane. Such components are used as a dicarboxylic monomer or a diamine monomer for copolymerization and is thus introduced into a bone structure. The component having a higher copolymerization ratio generally has a more excellent dissolving property for a solvent.

Examples of the solvent for dissolving the aromatic polyamide include tetramethyl urea, hexamethyl phospholamide, N,N-dimethyl acetamide, N-methyl-2-pyrrolidone, N-methylpiperidone-2, N,N-dimethylethylene urea, N,N,N',N'-tetramethyl allonic amide, N-methyl caprolactam, N-acethyl pyrrolidine, N,N-diethyl acetamide, N-ethyl pyrrolidone-2, N,N-dimethyl propionic amide, N,N-dimethyl isobutyl amide, N-methyl formamide, N,N-dimethyl propylene urea and their mixed systems. Furthermore, it is preferable to use an aprotic polar solvent such as N-methyl-2-pyrrolidone, N,N-dimethyl acetamide or N,N-dimethyl formamide in respect of a dissolving property and a solvent substitution speed for a coagulating solvent. More preferable examples include N-methyl-2-pyrrolidone.

Moreover, a solvent such as diethyleneglycol dimethyl ether or diethyleneglycol diethyl ether or diethyleneglycol dibutyl ether may be mixed to regulate the speed of a solvent substitution.

Preferably, the doping in the wet coagulation process is carried out by application at a temperature of −20 to 40° C. Moreover, it is possible to use any coagulating solution which does not dissolve a resin to be used and has a compatibility with the solvent. For the coagulating solution, water, alcohols such as methanol, ethanol and isopropyl alcohol and their mixed solution can be used, particularly, the water can be used suitably. The temperature of the coagulating solution at time of immersion is not particularly restricted but a temperature of 0 to 90° C. is preferable.

The polymer concentration of a film forming solution preferably ranges from 5% by weight to 25% by weight, more preferably, 7% by weight to 20% by weight. If the concentration is too high, a viscosity is excessively increased and handling is hard to perform. If the concentration is too low, a porous film tends to be formed with difficulty.

In order to regulate a pore shape and a pore size, an inorganic material such as lithium nitrate or an organic material such as polyvinyl pyrrolidone can also be added. It is preferable that the concentration of an additive should be 1% by weight to 10% by weight in a solution. If the lithium nitrate is added, the substitution speed of a solvent and a coagulating solution is increased and a finger void structure (a structure having a finger-like void) is formed in a sponge structure. When an additive for reducing a coagulation speed such as polyvinyl pyrrolidone is added, it is possible to obtain a porous film having a sponge structure expanded uniformly.

The film forming solution is applied to have a constant thickness and is immersed in a coagulating solution such as water and is thus coagulated or is left in a water vapor atmosphere and is thus coagulated and is then immersed in the water. Thus, the solvent is removed so that a porous film is formed. After the porous film is formed, it is taken out of the coagulating solution and is then dried. A drying temperature is not particularly limited but is desirably 200° C. or less.

In the present invention, the thickness of the application of the film forming solution may be regulated such that the height of the surface of the resin porous layer after the film formation is almost equal to that of the conductive bump. More specifically, it is preferable that a application thickness t ($\mu$m) should range from a height h1 ($\mu$m) of the conductive bump to h1+(h1×10) ($\mu$m) in consideration of a shrinkage coefficient of the film in the film formation. If the application thickness t is smaller than the height h1 of the conductive bump, the application step having high precision is carried out with difficulty. When the range is exceeded, there is a tendency that the step of exposing the upper surface of the conductive bump requires a long time.

The height h1 of the conductive bump according to the present invention is preferably 2 to 100 $\mu$m and more preferably 5 to 50 $\mu$m. When the height h1 is too great, the whole surface tends to be flattened with more difficulty. If the height h1 is too small, application unevenness is apt to be generated so that the flattening tends to be carried out with more difficulty. Furthermore, there is a possibility that the breakdown voltage of the porous layer to be an insulating layer might be reduced.

In the present invention, it is preferable that an upper surface $2b$ of the conductive bump $2a$ after the film formation should be exposed from the porous film 5 as shown in FIG. 1(f). The exposure can be achieved by regulating the application thickness t. In some cases, the thickness of the porous layer obtained by the contraction of the film is slightly smaller than that of the conductive bump. Accordingly, it is desirable that the upper surface of the conductive bump is exposed while the application thickness t is increased. Examples of such a method include a method of using a metal for repelling a film forming solution (i.e., a great contact angle) as a metal constituting the conductive bump. For such a metal, copper, aluminum, stainless and the like are used. Moreover, it is also possible to employ a method of carrying out a surface finishing process over the upper surface of the conductive bump.

In the case where the upper surface of the conductive bump is not exposed from the porous layer after the film formation, it is possible to remove a porous layer formed on a surface portion by sputter etching, a surface alkali processing, plasma etching, polishing roll or the like.

When the porous layer of the polyimide base resin is formed using a precursor (polyamide acid), a heat treatment is finally carried out at 200 to 500° C. so that the precursor (polyamide acid) is heated and ring-closed to produce polyimide.

As for the metal foil laminated plate obtained as described above, a pattern is formed on the metal foil by etching using an etchant so that a wiring layer is provided. An etchant is used for the etching depending on the type of a metal and a dry film resist or the like can be used for pattern etching.

Moreover, it is possible to impregnate the raw material composition of a thermosetting resin in the hole of the resin porous layer before or after the formation of the wiring pattern.

For a method of impregnating the raw material composition, it is possible to employ a method of directly applying a raw material solution of a thermosetting resin on the surface of a porous film by means of various coaters. However it is preferable to use a method in which a solid coated film obtained by coating the surface of a base material sheet with a raw material solution and drying the same surface is provided on the surface of the porous film and is impregnated by heating and pressurization. According to this method, it is possible to prevent aromatic polyamide from being swollen to deform the porous film due to a solvent contained in the raw material solution of the thermosetting resin.

As described above, it is possible to obtain a metal foil laminated plate including a metal foil including a conductive bump having an almost equal height, a resin porous layer provided integrally, and a thermosetting resin impregnated in the hole of the resin porous layer, the conductive bump being exposed from the resin porous layer.

The metal foil laminated plate is laminated integrally with the wiring layer to be a lower layer by heating and pressurizing after the pattern is formed if necessary, and is used for manufacturing a multiplayer wiring board. Moreover, the metal foil laminated plate is heated and pressurized together with the metal foil and is laminated integrally, and can be thus used as a double-sided metal laminated plate or a core substrate.

The metal foil laminated plate which is not impregnated with the thermosetting resin can be provided integrally with the metal foil or the wiring layer to be the lower layer by means of an adherent sheet or an adhesive.

EXAMPLE

Description will be given to a specific example of the present invention. The evaluation of the void rate and the like of a porous layer was carried out in the following manner.

(1) Void Rate of Whole Porous Layer void fate (%)={1−((weight/density)/volume)}×100

A volume and a weight of the porous layer were measured to obtain a void rate (porosity) by the above equation using the density of a material.

(2) Mean Pore Size of Surface of Porous Layer

The surface of the porous layer was photographed by using a scanning electron microscope (SEM) to obtain the mean pore size of the surface of the porous film.

Example of Preparation of Metal Foil with Bump

A patterned mask was formed on a metal foil having a weight of one ounce and a metal foil with a bump was prepared by etching. The metal foil with a bump had a bump height of 19 μm and a bump diameter of 50 μm.

Example 1 of Preparation of Polyimide Porous Layer

A film forming solution containing 15 parts by weight of BPDA (biphenyl-tetracarboxylic dianhydrate)-DDE (diamino diphenyleter)-PPD (paraphenylene diamine) based polyimide precursor and 85 parts by weight of N-methyl-2-pyrrolidone (NMP) was applied in a uniform thickness with a gap of 100 μm by using a film applicator over a surface provided with the conductive bump of a metal foil. The metal foil was immersed in pure water at 25° C. immediately after the application to coagulate the polyimide precursor. Drying was carried out at 90° C. for one hour or more after the coagulation. After the drying, a heat treatment was carried out for 3 hours at 400° C. in a nitrogen atmosphere and the polyimide precursor was heated and ring-closed to obtain a polyimide porous layer formed on a copper foil. This had a thickness of 17 μm and a finger void structure, and a whole void rate of 70% and a mean pore size of 5 μm. Moreover, the upper surfaces of the conductive bumps were wholly exposed.

By using the metal foil laminated plate, the raw material composition of the thermosetting resin containing a 50%-by-weight solution of methylethylketone of a brominated bisphenol A-type epoxy resin was applied and impregnated onto the porous film side for the porous layer so that an excellent impregnating property can be obtained.

Example 2 of Preparation of Polyimide Porous Layer

A metal foil laminated plate including a porous layer having a thickness of approximately 25 μm (a thickness of a portion having no bump) was manufactured in the same manner as in the example 1 of preparation except that a gap was set to 150 μm. While the upper surface of the conductive bump was not exposed from the metal foil laminated plate at all, surface polishing was carried out by a polishing roll so that the upper surface of the conductive bump could be exposed.

Example of Preparation of Aramid Porous Layer

Aromatic polyamide (Cornex produced by Teijin Limited) was dissolved in N-methyl-2-pyrrolidone (NMP), and furthermore, polyvinyl pyrrolidone (PVP) (K-90 produced by ISP Japan Co., Ltd.) and water were added to obtain a polymer solution containing aromatic polyamide (9 parts by weight), NMP (83 parts by weight), PVP (4 parts by weight) and water (4 parts by weight). The polymer solution was applied in a uniform thickness with a gap of 100 μm by using a film applicator over a surface provided with the conductive bump of a metal foil. Then, the metal foil was immediately immersed in a water tank at 60° C. to form a porous layer. Subsequently, the metal foil was preserved in the water for 24 hours and desolvation was carried out, and drying was then performed. The metal foil had a thickness of approximately 18 μm and had a finger void structure, and a whole vacancy rate of 70% and a mean pore size of approximately 8 μm. Moreover, the upper surface of the conductive bumps were wholly exposed.

By using the metal foil laminated plate, the raw material composition of the thermosetting resin containing a 50%-by-weight solution of methylethylketone of a brominated bisphenol A-type epoxy resin was applied and impregnated onto the porous film side for the porous layer so that an excellent impregnating property can be obtained.

What is claimed is:

1. A method of manufacturing a metal foil laminated plate comprising the steps of:

preparing a metal foil as a wiring layer on which conductive bumps each having substantially the same height are formed for interlayer connections; and forming and attaching a resin porous layer onto the metal foil by a wet coagulating method.

2. The method of manufacturing a metal foil laminated plate according to claim 1, wherein an amount of application of a film forming solution is regulated such that a height of a surface of the resin porous layer after film formation is almost equal to that of said conductive bump.

3. The method of manufacturing a metal foil laminated plate according to claim 1, wherein said resin porous layer comprises polyimide or aromatic polyamide.

4. The method of manufacturing a metal foil laminated plate according to claim 1, wherein said conductive bump is a metal bump formed by etching or plating.

5. A method of manufacturing a metal foil laminated plate comprising the steps of:

providing a metal foil as a wiring layer;

forming on the metal foil at least one conductive bump having a given height for interlayer connections, wherein the metal foil and the bump are in electrical contact;

forming and attaching a porous resin insulation layer onto the metal foil by a wet coagulating method to enclose the conductive bump in the porous resin insulation layer, said layer having a height substantially equal to the height of the conductive bump, wherein the conductive bump has a top surface which is not covered in the porous resin insulation layer.

6. The method according to claim 5, wherein the step of forming the bump comprises forming a metal layer on the metal foil, and etching the metal layer using a mask to form the conductive bump on the metal foil.

7. The method according to claim 5, wherein the step of forming the bump comprises plating the metal foil using a mask to form the conductive bump on the metal foil.

* * * * *